United States Patent
Baltrusch et al.

(10) Patent No.: US 12,396,117 B2
(45) Date of Patent: Aug. 19, 2025

(54) HOUSING FOR ELECTRONIC COMPONENTS, AND CONTROL UNIT

(71) Applicant: ZF Friedrichshafen AG, Friedrichshafen (DE)

(72) Inventors: Daniel Baltrusch, Orsingen-Nenzingen (DE); Hardy Wilkendorf, Sipplingen (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 330 days.

(21) Appl. No.: 17/752,452

(22) Filed: May 24, 2022

(65) Prior Publication Data

US 2022/0386492 A1     Dec. 1, 2022

(30) Foreign Application Priority Data

May 25, 2021   (DE) .......................... 102021205284.3

(51) Int. Cl.
*H05K 7/00* (2006.01)
*H01R 13/631* (2006.01)
*H05K 5/06* (2006.01)
*H05K 7/10* (2006.01)
*H05K 7/20* (2006.01)

(52) U.S. Cl.
CPC ............. *H05K 7/10* (2013.01); *H01R 13/631* (2013.01); *H05K 5/06* (2013.01); *H05K 7/20009* (2013.01)

(58) Field of Classification Search
None
See application file for complete search history.

(56) References Cited

U.S. PATENT DOCUMENTS

| | | | |
|---|---|---|---|
| 7,480,149 B2 * | 1/2009 | DeWard | H04N 23/54 361/728 |
| 9,649,995 B2 * | 5/2017 | Smyth | B60R 15/00 |
| 9,781,849 B2 * | 10/2017 | Negishi | H05K 5/0056 |
| 11,812,577 B2 * | 11/2023 | Uchida | H05K 7/1447 |
| 12,120,408 B2 * | 10/2024 | Solar | H04N 23/51 |

(Continued)

FOREIGN PATENT DOCUMENTS

| | | |
|---|---|---|
| CN | 105163544 A | 12/2015 |
| DE | 102012017755 A1 | 3/2013 |
| JP | 2012136172 A | 7/2012 |

*Primary Examiner* — Imani N Hayman
*Assistant Examiner* — Rashen E Morrison
(74) *Attorney, Agent, or Firm* — Kristin L. Murphy

(57) ABSTRACT

A housing for electronic components, for example, for a control unit of a vehicle is disclosed. The housing comprises a housing element having an upper wall and a peripheral wall surrounding three sides of the housing element, the upper wall and the peripheral wall defining an interior for receiving one or more electronic components, the housing element having on one side a substantially U-shaped receiving portion for receiving a connection element. The housing element may have a ventilation portion configured to allow a gas flow between the interior and the exterior of the housing element. The ventilation portion comprises a flow chamber having first and second opening, the first opening communicating with the atmosphere and the second opening communicating with the interior of the housing element. A corresponding control unit comprising such a housing is also disclosed.

29 Claims, 4 Drawing Sheets

(56) References Cited

U.S. PATENT DOCUMENTS

2007/0138773 A1* 6/2007 Song ................... B60R 21/233
                                                    280/730.2
2014/0080329 A1* 3/2014 Yamanaka ............... H05K 7/14
                                                    439/76.1

* cited by examiner

HOUSING FOR ELECTRONIC COMPONENTS, AND CONTROL UNIT

CROSS-REFERENCE TO RELATED APPLICATION

This application claims priority to German Priority Application No. 102021205284.3, filed May 25, 2021, the disclosure of which is incorporated herein by reference in its entirety.

TECHNICAL FIELD

The disclosure relates to a housing for electronic components, in particular for a control unit of a vehicle, and to a control unit having such a housing.

BACKGROUND

A control unit, for example an electronic control unit for an airbag or the engine of a vehicle, such as an airbag control unit or engine control unit, usually has housings with a plug interface, with a waterproof interior being provided inside the housing, with the electronic components, such as a printed circuit board or the like, being arranged in said interior. The housing and the plug interface are usually made from one part, in particular by a plastic injection molding process. For this purpose, the plug pins must first be combined in a pre-molded part and then overmolded together. Such a process is time-consuming and expensive. Furthermore, a high waterproofing of the housing is required, especially when used in a vehicle. If the interior of the housing is completely sealed, sealing elements, as well as the housing itself, may be subjected to excessive stress due to an increase or decrease in the internal pressure of the housing. This can reduce the reliability and durability of the housing and thus also of the control unit.

For example, an electronic control device having a housing with a housing ventilation opening is known from U.S. Pat. No. 9,781,849 B2. The outer opening of the housing ventilation opening is covered with a protective wall, and an air-permeable, waterproof membrane is attached to the inner opening of the housing ventilation opening.

Furthermore, document EP 3 250 014 A1 describes a housing which has a ventilation arrangement. The ventilation arrangement comprises a shielding part positioned outside the main compartment of the housing and defining a flow path, a communication channel extending between the interior of the main compartment and the flow path, and a blocking element arranged in the flow path to prevent or impede the flow of liquid from outside the housing into the communication channel.

SUMMARY

That is needed is to structurally and/or functionally improve a housing mentioned at the outset. In addition, what is needed is to structurally and/or functionally improve a control unit mentioned at the outset. For example, a plug interface is to be able to be assembled easily and inexpensively and/or the reliability and durability of the housing are to be improved.

A housing is disclosed herein. Furthermore, a control unit is also disclosed herein.

For example, a housing can be for or can serve for electronic components. The housing can be or can serve for receiving and/or housing electronic components. The housing can be for a control device or control unit. The housing can be part of a control device or a control unit. The housing and/or the electronic components can be for a control unit of a vehicle, such as a motor vehicle.

The housing can have a housing element. The housing element can have an upper wall and a peripheral wall. The peripheral wall can surround three sides of the housing element. The upper wall and/or the peripheral wall can form and/or define an interior for receiving one or more electronic components. The housing element can be a hood, such as housing hood, or a box, such as housing box. The housing element can be substantially rectangular, for example square, and/or cuboid. The housing element can be substantially box-shaped. The housing and/or the housing element can be made or produced from plastic. The housing and/or the housing element can be produced by a single or multiple injection molding process.

The housing element can have a substantially U-shaped receiving portion on one side, for example for receiving a connection element. The housing element can have four sides. The peripheral wall can be arranged on three sides of the housing element. The three sides of the housing element can be contiguous sides. The peripheral wall can be or can form or shape three side walls of the housing element. The peripheral wall can be or can form a continuous side wall running over three sides of the housing element. The fourth side of the housing element can be open. The peripheral wall and/or the three sides of the housing element can be arranged and/or oriented substantially perpendicularly to the upper wall. Two side walls of the housing element can be substantially parallel to each other. The peripheral wall can be substantially parallel to itself on two opposite sides. The receiving portion can be arranged on the fourth side of the housing element.

The substantially U-shaped receiving portion can be arranged on the outer peripheral edge of the upper wall and/or the peripheral wall. The substantially U-shaped receiving portion can be arranged on two opposite sides of the housing element. The substantially U-shaped receiving portion can be an edge portion of the upper wall and/or the peripheral wall. The substantially U-shaped receiving portion can be an overlapping edge. The substantially U-shaped receiving portion can extend on one side of the housing element to extend over substantially the entire outer peripheral edge. The receiving portion can be substantially U-shaped in cross-section. The receiving portion can be groove-shaped and/or can have a groove. The substantially U-shaped receiving portion can be open downwardly and/or inwardly. The substantially U-shaped receiving portion can be open inwardly and/or at the inner periphery of the housing element, as viewed in cross-section and/or longitudinal section. The substantially U-shaped receiving portion can be open toward and/or on a side opposite the upper wall. The substantially U-shaped receiving portion can be substantially open to the interior of the housing element. The substantially U-shaped receiving portion can define a window space. The connection element can protrude through the window space in a portion thereof. The connection element can project through the window space in some sections, for example into the interior of the housing element.

The substantially U-shaped receiving portion can have an upper portion running substantially parallel to the upper wall. The substantially U-shaped receiving portion can have one or two lateral portions running substantially parallel to the peripheral wall. The three portions of the receiving portion can form substantially a U, or can be arranged such that together they form substantially a U. The two lateral portions of the receiving portion can be arranged opposite each other. The two lateral portions of the receiving portion can be connected to the upper portion of the receiving portion. The two lateral portions of the receiving portion can be connected substantially perpendicularly to the upper portion of the receiving portion. The two lateral portions of the receiving portion can be connected to each other by or via the upper portion of the receiving portion.

The substantially U-shaped receiving portion can be configured to position the connection element on the housing element and/or to guide and/or hold the connection element in position on the housing element. The receiving portion can be a positioning device and/or positioning aid for the connection element. The receiving portion can be a holding device and/or holding aid for the connection element. The receiving portion can serve for guiding the connection element, for example for inserting the connection element and/or guiding it into position.

The housing element can have a sealing portion between the substantially U-shaped receiving portion and the upper wall and/or the peripheral wall. The sealing portion can be formed by the upper wall and/or peripheral wall. The sealing portion can have and/or define a sealing surface. The sealing surface can be arranged on the inner periphery of the housing element and/or the upper wall and/or the peripheral wall thereof. The sealing portion can be stepped and/or constricted towards the upper wall and/or peripheral wall, for example inwardly. The sealing portion can be stepped as viewed in cross-section towards the upper wall and/or peripheral wall. The sealing portion can be stepped towards the interior of the housing element.

The sealing portion can have an upper portion running substantially parallel to the upper wall. The sealing portion can have one or two lateral portions extending substantially obliquely to the peripheral wall. The lateral portions can be arranged opposite each other. The lateral portions can be interconnected by or via the upper portion.

The housing can have the connection element. The housing and the connection element can be separate parts, such as individual parts. The housing element and the connection element can be separate parts, such as individual parts. The housing element and the connection element can be produced as separate parts, such as individual parts. The connection element can be positioned and/or held and/or arranged in the substantially U-shaped receiving portion of the housing element, for example in some sections. The connection element can be a, for example electrical, socket or a, for example electrical, plug. The connection element can have at least one, for example electrical, connection terminal. The connection element can be configured to be connected to a connector, such as a plug connector. The connection element can have at least one, and in one exemplary arrangement, a plurality of, connection terminals, such as plug terminals or socket terminals. The connection terminals can be electrically connected to a printed circuit board and/or are configured to be electrically connected to a printed circuit board, such as a wiring circuit pattern of the printed circuit board. The printed circuit board can be arranged in the interior of the housing element. The printed circuit board can have electronic components, such as electronic assembly parts. The connection terminals can protrude or project into the interior of the housing element in some sections. The connection terminals can be exposed in some sections through the window space to the outside of the housing. The connection terminals can be connected to external connectors on the vehicle, such as plug connectors, plug terminals or socket terminals. By engaging the connection terminals with, in particular external, plug terminals or socket terminals, the printed circuit board can establish electrical connections with certain, in particular external, devices, such as sensors and/or actuators. The connection element and/or the printed circuit board can be part of a control device or a control unit.

The housing can have a housing cover. The housing cover can be a base plate. The housing cover can be made of metal or produced from metal. The housing cover can be substantially flat. The housing lid can be plate-shaped and/or disk-shaped. The housing cover can be a sheet metal part, for example bent, pressed and/or stamped. The connection element can be arranged on the housing cover. The connection element can be fixedly connected to the housing cover and/or can be configured to be fixedly connected to the housing cover. The connection element can be connected to the housing cover in a liquid-tight and/or gas-tight manner. A sealing element can be provided for this purpose. The connection element and the housing cover can be produced from one part and/or be integrally formed. The connection element and the housing cover can be glued, welded, soldered, screwed or riveted to each other. The housing cover can have a sealing element. The sealing element of the housing cover can be substantially annular in shape and/or arrangement. The sealing element of the housing cover can be substantially an open ring. The sealing element can be strip-shaped. The sealing element of the housing cover can be substantially U-shaped in design and/or arrangement. The sealing element of the housing cover can be arranged on one side, in particular on the side facing the housing element. The sealing element of the housing cover can be arranged be arranged between the housing cover and the housing element. The housing element can be connected to the housing cover in a liquid-tight and/or gas-tight manner. The sealing element of the housing cover is designed to seal the housing cover and the housing element with respect to one another, in particular in a liquid-tight and/or gas-tight manner. The sealing means of the housing cover can be made of or can be produced from rubber or plastic. The sealing element of the housing cover can be a resin, such as epoxy resin. The housing element and the housing cover can be glued, welded, soldered, screwed or riveted to each other.

The connection element can have a frame portion. The frame portion can protrude into and/or engage in the substantially U-shaped receiving portion of the housing element, for example in some sections. The frame portion can be arranged and/or arrangeable/positionable substantially perpendicularly to the upper wall of the housing element. The frame portion can be substantially perpendicular to a plug connection direction of the connection element. The frame portion can be substantially flat and/or plate-shaped. The frame portion can be a peripheral edge or edge portion of the connection element. The frame portion can be substantially perpendicular to a sleeve portion, such as bushing portion, of the connection element. The connection element can have the sleeve portion. The connection element can have a plurality of sleeve portions. The at least one sleeve portion can define a plug connection direction. The connection terminals can be arranged in the at least one sleeve portion, at least in some sections. The connection terminals can be arranged substantially perpendicular to the frame portion and/or substantially parallel to the sleeve portion. The connection terminals can be connection wires. The connection terminals can protrude and/or project at least in some sections into the sleeve portion.

The connection element and/or the housing cover can have a sealing portion corresponding to the sealing portion of the housing element.

The housing element can be connected to the connection element in a liquid-tight and/or gas-tight manner. The sealing portion of the housing element and/or of the connection element and/or of the housing cover can have a sealing element. A sealing element can be provided or arranged between the connection element and the housing element. A sealing element can be provided or arranged between the sealing portion of the housing element and the sealing portion of the connection element and/or of the housing cover. The sealing element can seal the connection element and the housing element with respect to each other, in particular in a liquid-tight and/or gas-tight manner. The sealing element can be made of or produced from rubber or plastic. The sealing element may, at least in some sections, have a shape corresponding to the sealing portion of the housing element and/or the connection element and/or the housing cover. The sealing element can be in the form of a strip. The sealing element can be a resin, such as epoxy resin. The sealing element can be applied in a space between the housing cover and the connection element or can be introduced there, for example filled in or injected. The connection element and the housing element can be bonded, welded, soldered, screwed or riveted to each other. The connection element can have substantially the measurements, such as dimensions, of one side of the housing element. The connection element can have substantially the measurements, such as dimensions, of a housing width. The width of the connection element can be substantially the same as the housing width. The connection element can be substantially the same size in cross-section as a side of the housing element. The side can be the side of the housing element on which the substantially U-shaped receiving portion is arranged. The connection element, in particular its frame portion, can be pushed or inserted, for example from below, into the substantially U-shaped receiving portion of the housing element, in particular until it abuts against the sealing element and/or against the upper portion of the receiving portion and/or rests there in a sealing manner. The interior can be sealed by the housing element, the housing cover and the connection element, in particular in a liquid-tight and/or gas-tight manner.

Additionally or alternatively, the housing element can have a ventilation portion. The ventilation portion can be configured so as to allow a gas flow between the interior and the exterior of the housing element. The ventilation portion can be a pressure equalization device. The ventilation portion can be configured to provide a pressure equalization between the interior of the housing element and the atmosphere. The ventilation portion can be arranged on the peripheral wall and/or upper wall of the housing element. The ventilation portion can be arranged in the region of the peripheral wall and/or upper wall of the housing element. The ventilation portion can be arranged at a corner and/or side of the housing element. The ventilation portion can form part of the peripheral wall and/or can be integrated in the peripheral wall. The ventilation portion can be formed integrally with the housing element and/or with the peripheral wall thereof, that is to say can consist of one part. The ventilation portion can be produced together with the housing element and/or with the peripheral wall thereof, for example by a plastic injection molding process.

The ventilation portion can comprise a flow chamber. The flow chamber can have a first opening and a second opening. The first and/or second opening(s) can be a pressure equalization opening(s). The first opening can be in connection or communication with the atmosphere and/or the flow chamber. The second opening can be in connection or communication with the interior of the housing element and/or the flow chamber. The first and/or second opening can be bores and/or can be substantially round in cross-section, such as circular. The ventilation portion can have a first channel. The first channel can form and/or define the first opening. The ventilation portion can have a second channel. The second channel can form and/or define the second opening. The first and/or second channel can be a pressure equalization channel(s). The first channel and the second channel can be fluidically connected to each other via the flow chamber. The second channel can reach or run from the interior into the flow chamber. The interior can be connected to the flow chamber, in particular fluidically, by the second channel. The first channel can reach or run from the flow chamber to outside the housing element. The connection to the atmosphere can be established through the first channel. The flow chamber can be connected to the atmosphere, in particular fluidically, or can communicate therewith by the first channel.

The first and second openings can be arranged substantially adjacently to each other. The first and second channels can be arranged substantially adjacently to each other. The first and second openings can be arranged substantially on opposite sides of the flow chamber. The first and second channels can be arranged substantially on opposite sides of the flow chamber. The first and second openings can be arranged substantially at an end of the flow chamber facing the upper wall of the housing element. The first and second channels can be arranged substantially at an end of the flow chamber facing the upper wall of the housing element. The first and second openings can be arranged substantially parallel to each other. The first and second channels can be arranged substantially parallel to each other and/or can run or be oriented substantially parallel to each other. The flow path of the first and/or second channel can be oblique to the flow path of the flow chamber. The flow paths can run obliquely to each other. The first and/or second channel(s) can be arranged at an angle less than or greater than 90° with respect to the flow chamber and/or the flow path of the flow chamber. The first and/or second channel(s) can meet the flow chamber and/or the flow path of the flow chamber at an angle less than or greater than 90°. The flow path of the first and/or second channel(s) can be arranged at an angle less than or greater than 90° to the flow path of the flow chamber. The flow path of the first and/or second channel(s) can meet the flow path of the flow chamber at an angle less than or greater than 90°. The first and/or second channel(s) can be arranged at an angle of 90° or perpendicularly to the flow chamber and/or the flow path of the flow chamber. The angle can be defined and/or enclosed by the flow path of the first and/or second channel and the flow path of the flow chamber. The angle can be formed between the flow path of the first or second channel and the flow path of the flow chamber. The flow path can correspond to or be defined by the particular longitudinal extent of the first channel, the second channel, or the flow chamber. The ventilation portion can have or define a substantially Z-shaped flow path or flow path portion.

The ventilation portion can have a third opening. The third opening can be connected to or in communication with the atmosphere and/or the flow chamber. The third opening can be a pressure equalization opening. The third opening can be a bore and/or can be substantially round in cross-section, such as circular, or angular, such as slot-shaped. The third opening can be a channel. The third opening can be formed as a grid opening. The third opening can be arranged substantially at an end of the flow chamber facing away from the upper wall of the housing element. When the housing and/or the housing element is arranged in a normal upright position, the first and/or second opening(s) can be higher above the ground than the third opening. When the housing and/or housing element is arranged in a normal upright position, the first and/or second channel(s) can be higher above the ground than the third opening. Water can drain through the third opening.

The housing element can have a bottom portion. The flow chamber can extend substantially between the bottom portion and the upper wall of the housing element. The bottom portion and the upper wall of the housing element can be substantially parallel to each other. The bottom portion can be a lower bottom portion. The bottom portion can be arranged opposite the upper wall of the housing element. The bottom portion can be an edge portion of the housing element. The bottom portion can be arranged on the peripheral wall of the housing element. The bottom portion can be an at least partially peripheral bottom portion of the housing element. The bottom portion, the peripheral wall and the upper wall can be formed in one piece, for example produced together or simultaneously by a plastic injection molding process. The flow chamber can extend substantially over the height of the peripheral wall of the housing element. The flow chamber and/or its flow path can extend substantially perpendicularly to the upper wall and/or the bottom portion of the housing element. The flow chamber and/or its flow path can extend substantially obliquely to the upper wall and/or the peripheral wall and/or the bottom portion of the housing element. The flow chamber and/or its flow path can/can extend substantially obliquely to the upper wall and/or the peripheral wall and/or the bottom portion of the housing element when the housing and/or housing element is arranged in a normal upright position. The flow chamber and/or flow path thereof, when the housing and/or housing element is arranged in a normal upright position, can extend substantially obliquely to the normal of the upper wall and/or to the normal of the peripheral wall and/or to the normal of the bottom portion of the housing element. The angle of the obliqueness can be less than or greater than 90°.

The ventilation portion and/or the flow chamber can have an outer surface which is rounded and/or rounded off at least in some sections. The outer surface of the ventilation portion can be arranged and/or formed in the region of the flow chamber. This outer surface can be configured to allow a liquid, such as water, to drain therefrom or flow down the outside of the housing element, in particular without any or at least without substantial penetration into the first opening of the ventilation portion. The outer surface can be part of the peripheral wall.

A control unit and/or a control device, in particular for a vehicle, such as motor vehicle, can have the housing described above and/or below. The control device or the control unit can be for a vehicle, such as motor vehicle. The control unit and/or control device can be a control unit or a control device for an airbag or the engine of a vehicle. The control unit and/or the control device can be an airbag control unit/device, brake control unit/device, or engine control unit/device. The control unit and/or the control device can be a vehicle control device or a part thereof. The control unit and/or control device can be a driver assistance system and/or a safety system, such as an emergency braking system and/or a collision avoidance system, or part thereof. The emergency braking system can be an automatic emergency braking system. The control unit and/or the control device can be a waterproof control unit and/or control device. The control unit and/or the control device can have electronic components and/or printed circuit boards. The electronic components and/or printed circuit boards can be arranged in the housing, in particular in the interior of the housing or housing element, of the control unit and/or the control device.

In other words, the housing, such as housing element, and the plug, such as connection element, can be or are produced as individual parts. They can then be glued together. The housing, such as housing element, and the plug, such as connection element, can be glued together. The measurements of the housing or housing element can be predetermined. The interface between the plug and the housing, such as housing element, can be or can become, for example, strongly constricted.

With the disclosure, a cost-effective implementation of the requirements of a waterproof control unit can be possible, taking into account the maximum dimensions. The plug interface can be assembled easily and economically. The water tightness of the housing can be increased and/or a pressure equalization can be enabled. The reliability and durability of the housing can be improved.

BRIEF DESCRIPTION OF DRAWINGS

In the following, exemplary arrangements of the disclosure are described in more detail with reference to figures, which show schematically and by way of example.

DETAILED DESCRIPTION

Figure 1:
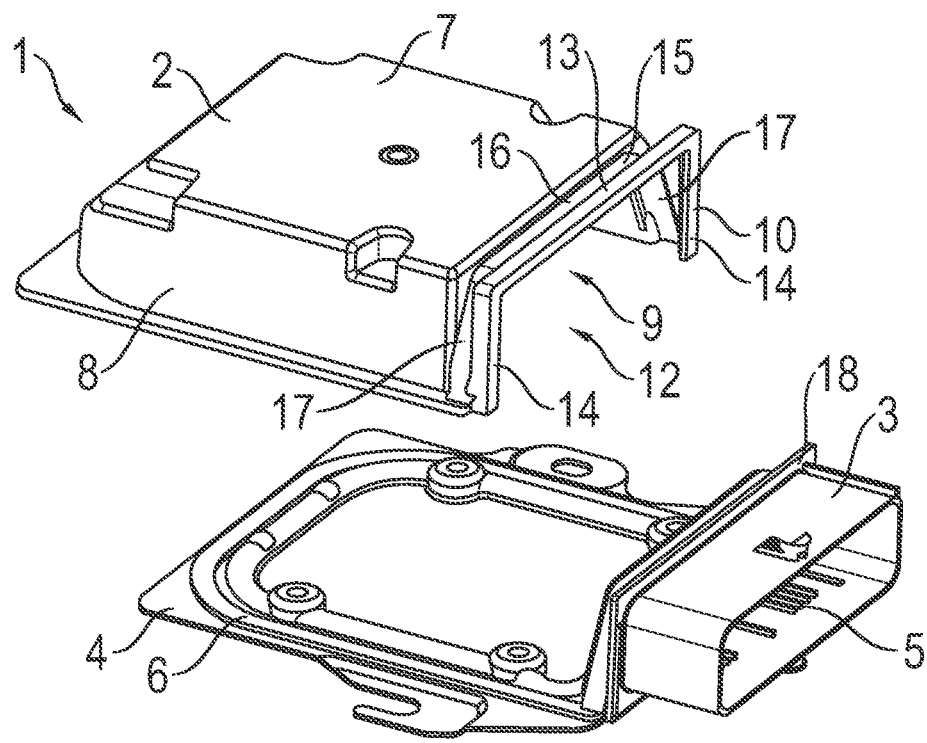
FIG. 1 a perspective view of a housing for a control unit in an unassembled state.

FIG. 1 shows a perspective view of a housing 1 for a control unit of a motor vehicle in the unassembled state. The housing 1 is used for waterproof storage of electronic components of the control unit.

The housing 1 has a housing element 2, a connection element 3 and a housing cover 4. The housing element 2 is designed as a housing cover. The connection element 3 is designed as a socket with electronic terminals 5, In one exemplary arrangement, the housing cover 4 is designed as a base plate with a sealing element 6. The housing cover 4 and the housing element 2 can be screwed to each other, with the sealing element 6 sealing the housing cover 4 and the housing element 2 together in a fluid-tight manner. The connection element 3 and the housing cover 4 are connected to each other in a fluid-tight manner.

The housing element 2 has an upper wall 7 and a peripheral wall 8. The peripheral wall 8 surrounds three sides of the housing element 4. The upper wall 7 and the peripheral wall 8 form and define an interior 9 for receiving one or more electronic components of the control unit.

Figure 2:
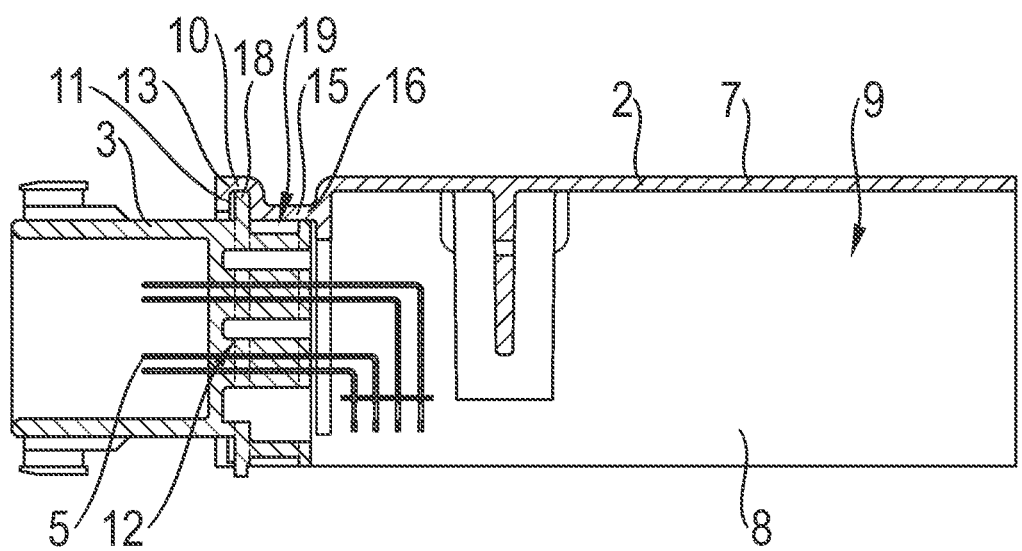
FIG. 2 a first sectional view of the housing of FIG. 1.
Figure 3:
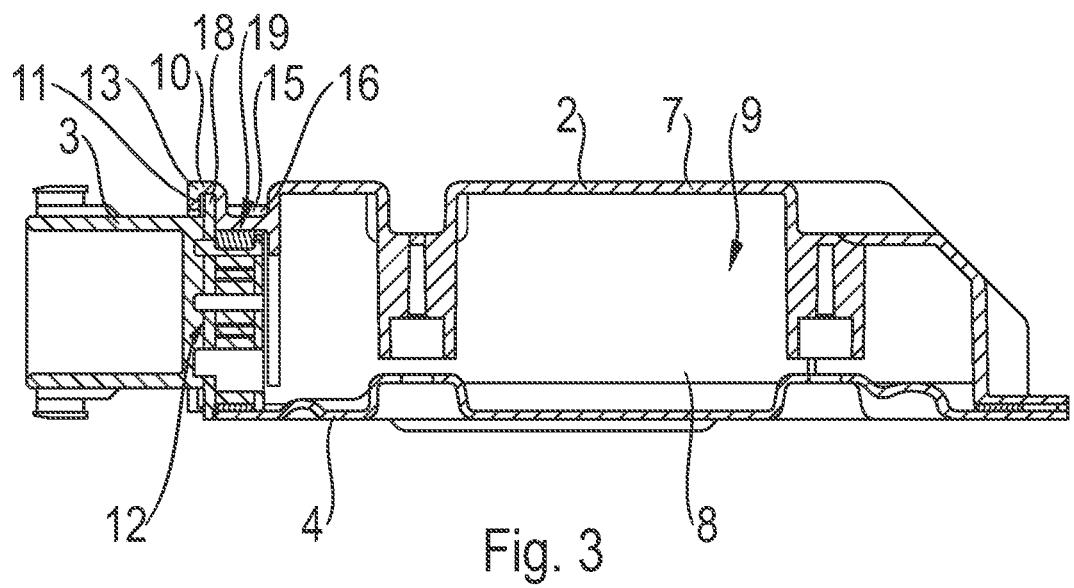
FIG. 3 a second sectional view of the housing of FIG. 1.

FIGS. 2 and 3 show two different sectional views of the housing 1 in the assembled state. As shown in FIGS. 1 to 3, the housing element 2 has a substantially U-shaped receiving portion 10 on one side for receiving the connection element 3. The substantially U-shaped receiving portion 10 is arranged at the outer peripheral edge of the upper wall 7 of the peripheral wall 8 and in one exemplary arrangement, extends substantially over the entire outer peripheral edge at the side of the housing element 2.

The receiving portion 10 is substantially U-shaped in cross-section and is open downwardly and inwardly. The receiving portion 10 forms a groove 11 so to speak, running around three side parts. Furthermore, the substantially U-shaped receiving portion 10 defines a window space 12, through which the connection element 3 projects in some sections into the interior 9 of the housing element 2.

The receiving portion 10 has an upper portion 13 running substantially parallel to the upper wall 7 and two lateral portions 14 running substantially parallel to the peripheral wall 8. The receiving portion 10 is configured so as to position the connection element 3 on the housing element 2 or to guide it and hold it in position.

The housing element 2 has a sealing portion 15 between the substantially Li-shaped receiving portion 10 and the upper wall 7 and peripheral wall 8. The sealing portion 15 is stepped or constricted inwardly toward the upper wall 7 and substantially toward the peripheral wall 8. The sealing portion 15 has an upper portion 16 running substantially parallel to the upper wall 7 and two lateral portions 17 running substantially obliquely to the peripheral wall 8.

As can be seen in FIGS. 2 and 3, the connection element 3 is positioned in the substantially U-shaped receiving portion 10 of the housing element 2. The connection element 3 has a frame portion 18 which protrudes or engages into the substantially U-shaped receiving portion 10 of the housing element 2. A sealing element 19 is provided between the connection element 3 and the housing element 2 or the sealing portion 15 and seals the connection element 3 and the housing element 2 in a liquid-tight and gas-tight manner with respect to each other.

Figure 4:
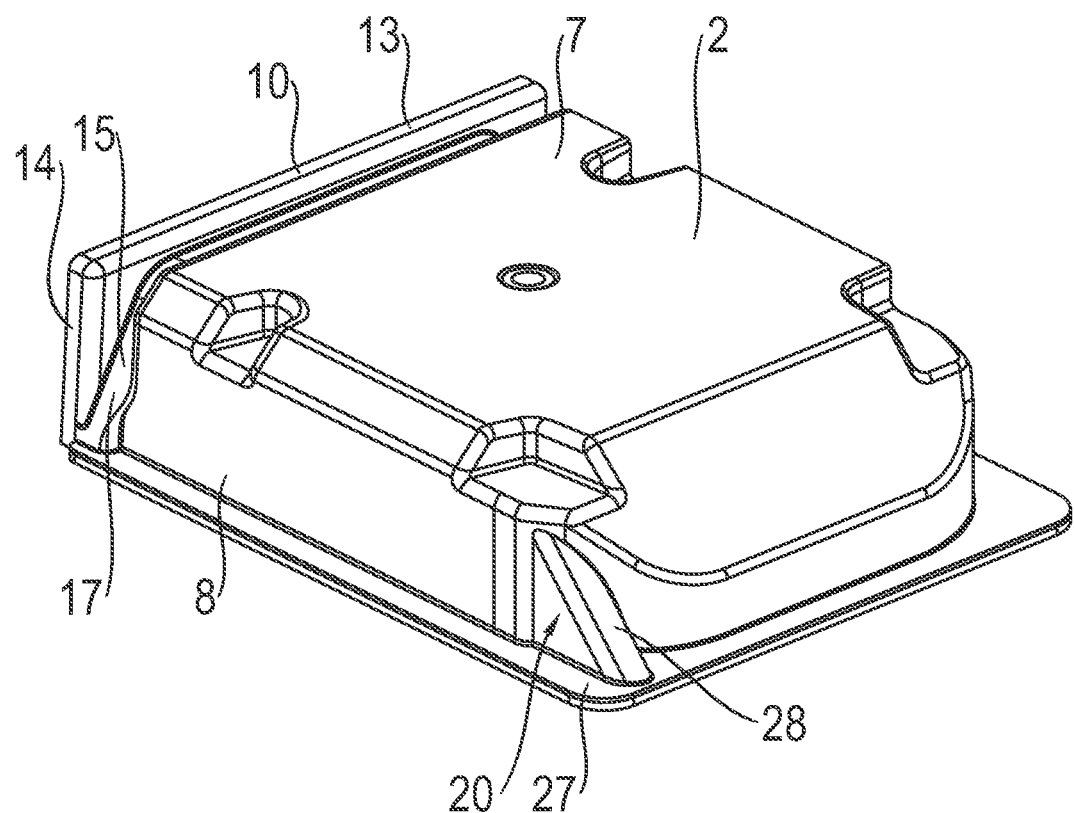
FIG. 4 a perspective view of the housing element of the housing of FIG. 1.
Figure 5:
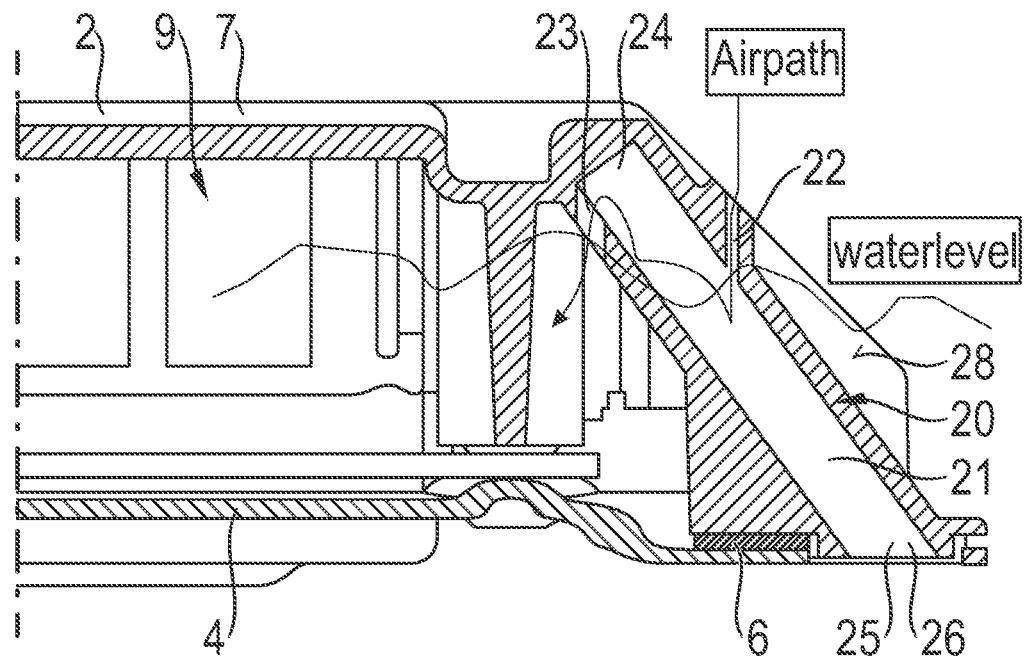
FIG. 5 a sectional view of a ventilation portion of the housing of FIG. 1.

FIG. 4 shows a perspective view of the housing element 2 of the housing 1 having a ventilation portion 20, and FIG. 5 shows a sectional view of the ventilation portion 20 of the housing 1. The housing element 2 has the ventilation portion 20, which is configured to allow a gas flow between the interior 9 and the exterior of the housing element 2. The ventilation portion 20 comprises a flow chamber 21. The ventilation portion 20 has a first channel 22 and a second channel 23. The first channel 22 forms a first opening and the second channel 23 forms a second opening. The first channel 22 is in fluidic communication with the atmosphere and the flow chamber 21. The second channel 23 is in fluidic communication with the interior 9 of the housing element 2 and the flow chamber 21. The first channel 22 and the second channel 23 are fluidically connected to each other via the flow chamber 21.

The first channel 22 and the second channel 23 are arranged on opposite sides of the flow chamber 21 substantially adjacently to each other. The first channel 22 and the second channel 23 are arranged substantially at an end 24 of the flow chamber 21 facing the upper wall 7 of the housing element 2. The first channel 22 and the second channel 23 are oriented substantially parallel to each other. The first channel 22 and the second channel 23 are arranged at an angle smaller and greater than 90°, respectively, to the flow chamber 21 and to the flow path of the flow chamber 21.

The ventilation portion 20 has a third opening 25 in fluid communication with the atmosphere and the flow chamber 21. The third opening 25 is arranged substantially at an end 26 of the flow chamber 21 remote from the upper wall 7 of the housing element 2. When the housing 1 or the housing element 2 is arranged in a normal upright position, the first channel 22 and the second channel 23 are higher above the around than the third opening 25. Water, for example, can flow through the third opening.

The housing element 2 also has a partially peripheral bottom portion 27 oriented substantially parallel to the upper wall 7. The flow chamber 21 extends substantially between the bottom portion 27 and the upper wall 7, the flow chamber 21 and its flow path being substantially oblique to the upper wall 7, to the peripheral wall 7 and to the bottom portion of the housing element 2.

The ventilation portion 20 has, in particular in the region of the flow chamber 21, an outer surface 28 which is rounded at least in some sections. This outer surface 28 is designed to allow a liquid, such as water, to flow off it or to flow down the outside of the housing element 2, in particular without any or at least without substantial penetration into the first channel 22 of the ventilation portion 20.

For the rest, reference is made by way of complement in particular to FIGS. 1 to 3 and the associated description.

Figure 6:
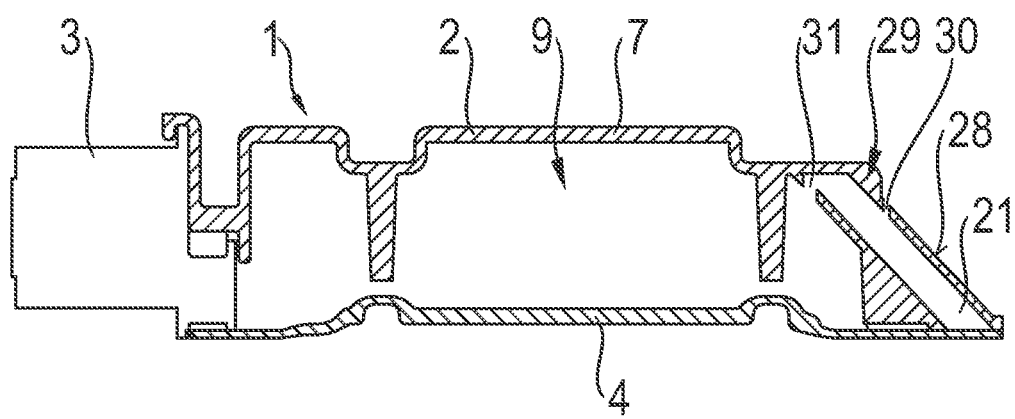
FIG. 6 a sectional view of a housing with an alternative ventilation portion.

FIG. 6 shows a sectional view of a housing 1 with an alternative ventilation portion 29. The housing 1 and the ventilation portion 29 are substantially like the housing 1 described above and/or below with reference to FIGS. 1 to 5 and the ventilation portion 20 thereof.

However, as can be seen in FIG. 6, instead of a first and second channel 22, 23, the ventilation portion 29 has a first opening 30 and a second opening 31. The first opening 30 and the second opening 31 are formed as bores in the wall of the flow chamber 21 and perform the same function as the first channel 22 and the second channel 23 of the ventilation portion 20 shown in FIGS. 4 and 5.

For the rest, reference is made by way of complement in particular to FIGS. 1 to 5 and the associated description.

Figure 7:
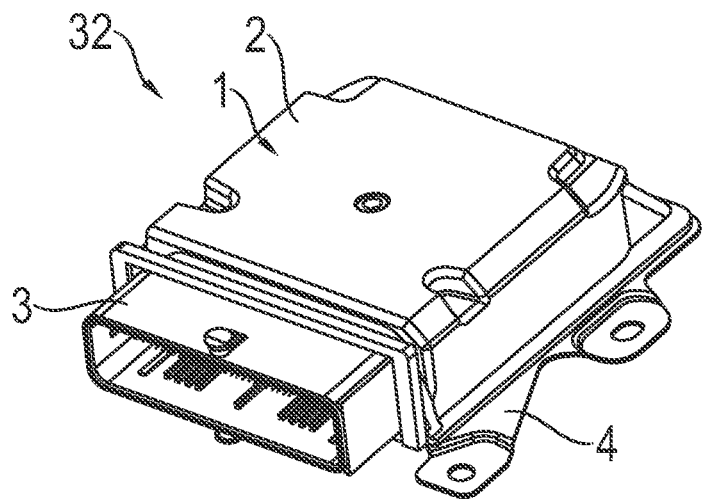
FIG. 7 a perspective view of a control unit with the housing of FIG. 1.
Figure 8:
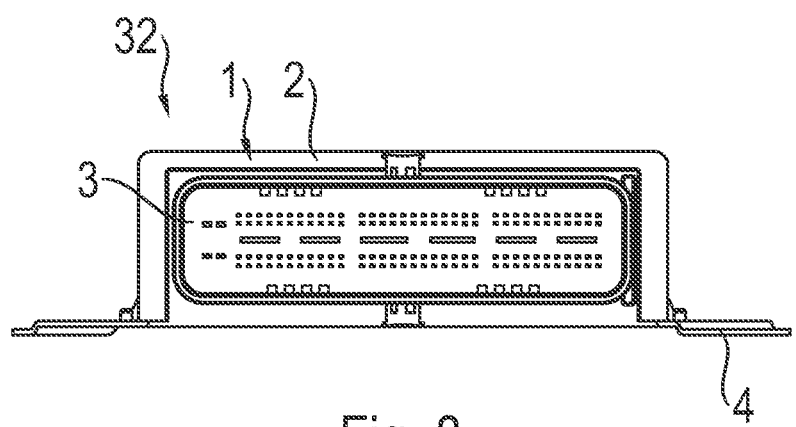
FIG. 8 a front view of the control unit of FIG. 7.
Figure 9:
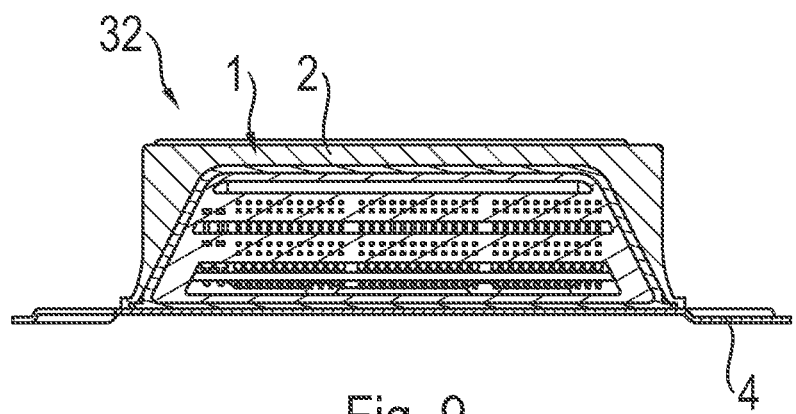
FIG. 9 a view of the plug to housing interface of the control unit of FIG. 7.

FIG. 7 shows a perspective view of a waterproof control unit 32 with the housing 1 described above and/or below according to FIGS. 1 to 5 in the assembled state. The control unit is for a motor vehicle. For example, the control unit may be an airbag control unit or brake control unit. The housing 1 of the control unit 32 has the housing element 2, the connection element 3 and the housing cover 4. A printed circuit board with electronic components of the control unit is arranged in the interior 9 of the housing 1, which is enclosed by the housing 1 in a substantially watertight manner. The printed circuit board is electrically connected to the connection element 3 or to electrical terminals 5 thereof. FIG. 8 shows a front view of the control unit 32 with the connection element 3 and the electrical terminals 5. The connection element 3 is inserted by its frame portion 18 from below into the substantially U-shaped receiving portion 10 of the housing element 2, so that it abuts against the sealing element 19 and thus against the upper portion 16 of the receiving portion 10, where it is in sealing contact. FIG. 9 shows a view of the interface of connection element 3 to the housing element 2 of the control unit 32.

In addition, reference is made in particular to FIGS. 1 to 5 and the associated description.

Optional features of the disclosure are designated in particular by "can". Accordingly, there are also further development and/or exemplary arrangements of the disclosure which additionally or alternatively have the particular feature or features.

If necessary, isolated features can also be selected from the feature combinations disclosed herein and used in combination with other features to delimit the subject matter of the claim, while breaking down any structural and/or functional relationship possibly existing between the features.

The invention claimed is:

1. A housing for electronic components, for a control unit of a vehicle, comprising a housing element which has an upper wall and a peripheral wall surrounding three sides of the housing element, the upper wall and the peripheral wall defining an interior for receiving one or more electronic components, wherein the housing element has on one side a substantially U-shaped receiving portion for receiving a connection element, wherein the housing element has a ventilation portion which is configured to allow a gas flow between the interior and an exterior of the housing element, the ventilation portion comprising a flow chamber extending from the upper wall to a bottom portion of the housing element, a flow chamber extending from the upper wall to a bottom portion of the housing element, a first channel that communicates with the atmosphere and extends through an upper surface of the flow chamber, and a second channel that communicates with the interior of the housing element and extends through a bottom surface of the flow chamber, wherein the first channel and the second channel are arranged parallel to one another and on opposite sides of the flow chamber creating a substantially Z-shaped flow path, wherein the ventilation portion has a third opening arranged at an end of the flow chamber facing away from the upper wall, and wherein when the housing element is arranged in a normal upright position, the first channel and the second channel are higher above the ground than the third opening.

2. The housing as claimed in claim 1, wherein the first and second channels are arranged substantially adjacently to each other.

3. The housing as claimed in claim 1, wherein the first and/or second channel is/are arranged at an angle smaller than or greater than 90° to the flow chamber and/or to the flow path of the flow chamber.

4. A housing for electronic components for a control unit of a vehicle, comprising a housing element having an upper wall and a peripheral wall surrounding three sides of the housing element, the upper wall and the peripheral wall defining an interior for receiving one or more electronic components, wherein the housing element has a ventilation portion configured to allow a gas flow between the interior and an exterior of the housing element, the ventilation portion comprising a flow chamber defined by an outer wall and an inner wall that are arranged parallel to one another, wherein the flow chamber has first and second openings, the first opening formed through the outer wall and communicating with the atmosphere and the second opening formed through the inner wall and communicating with the interior of the housing element, wherein the first opening and the second opening are arranged on opposite sides of the flow chamber creating a substantially Z-shaped flow path.

5. The housing as claimed in claim 4, wherein the housing element has on one side a substantially U-shaped receiving portion for receiving a connection element.

6. The housing as claimed in claim 5, wherein the substantially U-shaped receiving portion is arranged on the outer peripheral edge of the upper wall and/or the peripheral wall.

7. The housing as claimed in claim 5, wherein the substantially U-shaped receiving portion on one side of the housing element extends substantially over the entire outer peripheral edge.

8. The housing as claimed in claim 5, wherein the receiving portion is substantially U-shaped in cross-section.

9. The housing as claimed in claim 5, wherein the substantially U-shaped receiving portion is open downwardly and/or inwardly.

10. The housing as claimed in claim 5, wherein the substantially U-shaped receiving portion defines a window space through which the connection element can protrude in some sections, into the interior of the housing element.

11. The housing as claimed in claim 5, wherein the substantially U-shaped receiving portion has an upper portion running substantially parallel to the upper wall and/or two lateral portions running substantially parallel to the peripheral wall.

12. The housing as claimed in claim 5, wherein the substantially U-shaped receiving portion is configured so as to position the connection element on the housing element and/or to guide it into position and/or hold it in position.

13. The housing as claimed in claim 5, wherein the housing element between the substantially U-shaped receiving portion and the upper wall has a sealing portion.

14. The housing as claimed in claim 13, wherein the sealing portion is stepped toward the upper wall.

15. The housing as claimed in claim 13, wherein the sealing portion has an upper portion running substantially parallel to the upper wall and/or two lateral portions running substantially obliquely to the peripheral wall.

16. The housing as claimed in claim 5, wherein the housing has the connection element, the connection element being positioned in the substantially U-shaped receiving portion of the housing element.

17. The housing as claimed in claim 16, wherein the connection element has a frame portion projecting and/or engaging into the substantially U-shaped receiving portion of the housing element.

18. The housing as claimed in claim 16, wherein between the connection element and the housing element, a sealing element is provided, which seals the connection element and the housing element with respect to each other, in a liquid-tight and/or gas-tight manner.

19. The housing as claimed in claim 4, wherein the first channel and the second channel are fluidically connected to each other via the flow chamber.

20. The housing as claimed in claim 4, wherein the first and second opening are arranged substantially on opposite sides of the flow chamber.

21. The housing as claimed in claim 4, wherein the first and second opening are arranged substantially at an end of the flow chamber facing the upper wall of the housing element.

22. The housing as claimed in claim 4, wherein the first and second opening are arranged substantially parallel to each other.

23. The housing as claimed in claim 4, wherein the ventilation portion has a third opening communicating with the atmosphere.

24. The housing as claimed in claim 23, wherein the third opening is arranged substantially at an end of the flow chamber facing away from the upper wall of the housing element.

25. The housing as claimed in claim 4, wherein the housing element has a bottom portion, the flow chamber extending substantially between the bottom portion and the upper wall.

26. The housing as claimed in claim 4, wherein the flow chamber and/or its flow path extends substantially obliquely to the upper wall and/or peripheral wall and/or bottom portion of the housing element.

27. The housing as claimed in claim 4, wherein, when the housing and/or the housing element is arranged in a normal upright position, the first and/or second opening or the first and/or second channel is higher above the ground than a third opening.

28. The housing as claimed in claim 4, wherein the ventilation portion and/or the flow chamber has an outer surface which is rounded at least in some sections.

29. A control unit for a vehicle, the control unit having a housing as claimed in claim 4.

\* \* \* \* \*